(12) United States Patent
Loughmiller

(10) Patent No.: US 7,053,650 B2
(45) Date of Patent: May 30, 2006

(54) COMMUNICATION DEVICE FOR A LOGIC CIRCUIT

(75) Inventor: Daniel R. Loughmiller, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/926,898

(22) Filed: Aug. 25, 2004

(65) Prior Publication Data

US 2005/0024093 A1    Feb. 3, 2005

Related U.S. Application Data

(60) Continuation of application No. 10/622,907, filed on Jul. 17, 2003, now Pat. No. 6,822,475, which is a division of application No. 10/112,380, filed on Mar. 28, 2002, now Pat. No. 6,628,144, which is a continuation of application No. 09/467,667, filed on Dec. 17, 1999, now Pat. No. 6,396,300, which is a division of application No. 09/023,639, filed on Feb. 13, 1998, now Pat. No. 6,114,878.

(51) Int. Cl.
*H03K 19/00* (2006.01)

(52) U.S. Cl. .......................................... 326/38; 326/82

(58) Field of Classification Search .................. 326/16, 326/37, 38, 82, 83; 327/407, 408, 534, 535
See application file for complete search history.

(56) References Cited

U.S. PATENT DOCUMENTS

| | | | |
|---|---|---|---|
| 4,533,841 A | 8/1985 | Konishi | 326/38 |
| 5,107,208 A | 4/1992 | Lee | 714/733 |
| 5,272,365 A | 12/1993 | Nakagawa | 257/194 |
| 5,402,390 A | 3/1995 | Ho et al. | 365/225.7 |
| 5,517,455 A | 5/1996 | McClure et al. | 365/225.7 |
| 5,526,317 A | 6/1996 | McClure | 365/225.7 |
| 5,726,585 A | 3/1998 | Kim | 326/38 |
| 5,859,442 A | 1/1999 | Manning | 257/48 |
| 5,929,691 A | 7/1999 | Kim et al. | 327/525 |

FOREIGN PATENT DOCUMENTS

JP    3-196536    8/1991

*Primary Examiner*—Don Le
(74) *Attorney, Agent, or Firm*—TraskBritt, PC

(57) ABSTRACT

A circuit is provided to isolate a contact pad from a logic circuit of a die once the contact pad is no longer needed. This circuit can take many forms including a CMOS multiplexer controlled by a fuse or anti-fuse, an NMOS or PMOS pass gate controlled by a fuse or anti-fuse, or even a fusible link which is severed to effect isolation. Additionally, a circuit is provided that switchably isolates one of two contact pads from a logic circuit.

1 Claim, 10 Drawing Sheets

COMMUNICATION DEVICE FOR A LOGIC CIRCUIT

RELATED APPLICATIONS

This application is a continuation of U.S. application Ser. No. 10/622,907, filed Jul. 17, 2003 and issued as U.S. Pat. No. 6,822,475 on Nov. 23, 2004; which is a divisional of U.S. application Ser. No. 10/112,380, filed Mar. 28, 2002 and issued as U.S. Pat. No. 6,628,144 on Sep. 30, 2003; which is a continuation of U.S. application Ser. No. 09/467,667, filed Dec. 17, 1999 and issued as U.S. Pat. No. 6,396,300 on May 28, 2002; which is a divisional of U.S. application Ser. No. 09/023,639, filed Feb. 13, 1998 and issued as U.S. Pat. No. 6,114,878 on Sep. 5, 2000.

TECHNICAL FIELD

This invention relates generally to electronic devices and, more specifically, to a circuit and method for isolating a contact pad from a logic circuit.

BACKGROUND OF THE INVENTION

Processed semiconductor wafers typically comprise an array of substantially isolated integrated circuitry locations, which are subsequently separated to form semiconductor dies. In order to test the operability of the integrated circuitry of a die location on a wafer, a wafer probe card is applied to each die location. The wafer probe card includes a series of pins that are placed in physical contact with a die location's contact pads, which in turn connect to the die location's circuitry. The pins apply voltages to the input contact pads and measure the resulting output electrical signals from the output contact pads. However, the wafer probe card's pins may not be able to extend to all of the contact pads. As a result, it is necessary to provide accessible redundant contact pads on the die location and couple them to particular logic circuits.

An additional hardware limitation relevant to testing the die locations is the spacing between the pins of the wafer probe card. Specifically, the pins may be spaced further apart than the contact pads in a particular area of a die location. As a result, one contact pad in that area may not be serviceable by a pin. As a solution, prior art teaches providing a redundant contact pad in another area of the die location that can be reached by a pin. This redundant pad is connected to the same logic circuit as the unserviceable contact pad.

There may also be other reasons for including additional contact pads on a die. Regardless of the reasons, prior art allows these redundant contact pads to remain connected to the logic circuit after they are no longer needed. By remaining connected, these redundant contact pads contribute additional capacitance to their associated logic circuits and thereby degrade performance of the die.

SUMMARY OF THE INVENTION

Accordingly, the present invention provides a circuit for isolating a contact pad from a logic circuit. In a first exemplary embodiment, a complementary metal-oxide semiconductor (CMOS) multiplexer connects a redundant pad to a logic circuit, wherein the CMOS multiplexer is controlled by a fuse. Programming the fuse disables the multiplexer and prevents the redundant contact pad from affecting the logic circuit. Thus, this embodiment has the advantage of removing a parasitic component that might degrade performance of the logic circuit.

In a second exemplary embodiment, one fuse circuit controls several multiplexers, wherein each multiplexer services a separate logic circuit. This embodiment offers the advantage of reducing capacitance of several logic circuits while simultaneously conserving the die space needed to do so.

In a third exemplary embodiment, one fuse circuit controls two multiplexers, wherein both multiplexers service the same logic circuit. In addition to interposing a first multiplexer between the redundant contact pad and the logic circuit, a second multiplexer is interposed between a main contact pad and the logic circuit. Further, this second multiplexer is configured to operate conversely to the first multiplexer. Thus, before the fuse is programmed, only the redundant contact pad is in electrical communication with the logic circuit. After the fuse is programmed, only the main contact pad is in electrical communication with the logic circuit. The advantage offered by this embodiment is that, while one contact pad is being used, the other contact pad does not contribute additional capacitance.

A fourth exemplary embodiment combines the features described in the second and third exemplary embodiments. Thus, not only does one fuse control the electrical communication of several logic circuits, but the fuse also controls which contact pad can be used with each logic circuit. Accordingly, this embodiment combines the advantages found in the second and third embodiments. A fifth embodiment achieves the same advantages discussed above using an anti-fuse in place of the fuse. In addition, all of the embodiments listed above provide capacitance-reducing advantages while avoiding accidental programming of the fuse due to an ESD event.

Moreover, a sixth exemplary embodiment replaces the fuse controlled multiplexer with the fuse itself for linking the redundant contact pad with the logic circuit. In doing so, this embodiment offers all of the capacitance-reducing advantages of the embodiments discussed above and takes up less die space.

In a seventh exemplary embodiment, an isolation circuit is used during a test mode to connect a logic circuit to a no-connect pin on an integrated device, thereby providing the advantage of having an additional access point for testing the integrated device. Once the test mode has ended, the fusing element is programmed and the no-connect pin electrically disconnects from the logic circuit.

In an eighth exemplary embodiment, a die is provided having two groups of contact pads, wherein each group is configured to accommodate a different lead frame. One contact pad from each group is connected to a particular logic circuit. An isolation circuit similar to the fourth exemplary embodiment is provided to regulate electrical communication with the contact pads. Specifically, in an unprogrammed state, the isolation circuit electrically isolates the second group of contact pads from the logic circuits. The first group remains in electrical communication with the logic circuits and may accommodate an appropriate lead frame. If, on the other hand, a lead frame is chosen that is compatible with the second group of contact pads, then the entire first group 64 can be isolated in a single programming step that also serves to enable communication between the entire second group 66 and the logic circuits. This embodiment has the advantage of providing a die that is compatible with two different types of lead frames. In addition, the adaptation requires at most one programming step. As a further advantage, this embodiment restricts additional capacitance from unneeded contact pads once the appropriate lead frame has been determined.

A ninth exemplary embodiment is configured in a manner similar to the eighth embodiment. Rather than including one all-encompassing isolation circuit, however, this embodiment includes several isolation circuits—one for each logic circuit. Each isolation circuit resembles the third exemplary embodiment in that the isolation circuit can be used to determine which contact pad communicates with the logic circuit—either the pad from the first group or the pad from the second group. By allowing a programming choice for each logic circuit, this embodiment provides a die that can adapt to other lead frames in addition to the two lead frames addressed in the eighth embodiment. Accordingly this embodiment also restricts additional capacitance from unneeded contact pads once the appropriate lead frame has been determined.

In addition to these circuit embodiments, the present invention encompasses various methods for achieving these advantages.

DETAILED DESCRIPTION OF THE PREFERRED EMBODIMENTS

Figure 1:
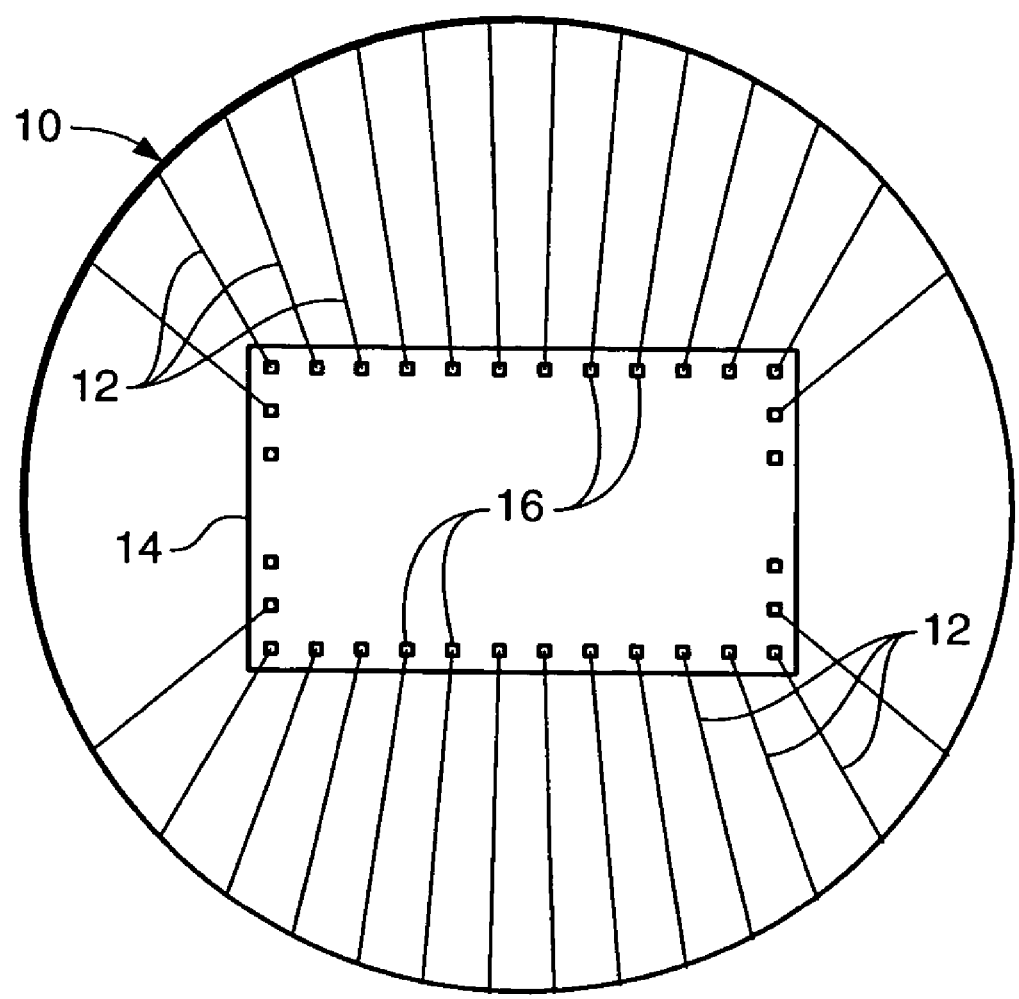
FIG. 1 depicts a wafer probe card superimposed over a die.

FIG. 1 illustrates the top view of a wafer probe card 10 having a series of pins 12 extending from two sides of the wafer probe card 10. In order to test a particular die 14 on a wafer, this wafer probe card 10 is placed over the die 14. The die 14 includes a plurality of contact pads 16. For purposes of this application, a contact pad is defined to include any conductive surface configured to permit temporary or permanent electrical communication with a circuit or node. During testing, the pins 12 of the wafer probe card 10 are in communication with nearby contact pads 16. Given the configuration of the wafer probe card 10, however, the pins 12 may not be able to reach contact pads 16 on certain areas of the die 14.

Figure 2:
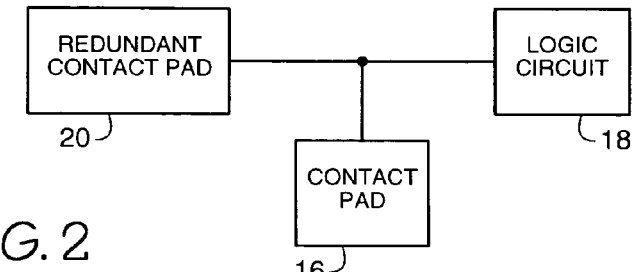
FIG. 2 demonstrates a circuit used in the prior art for testing a logic circuit on a die.

FIG. 2 demonstrates the solution in the prior art for this problem. If the contact pad 16 for a logic circuit 18 cannot be accessed by the wafer probe card 10, then a redundant contact pad 20 is provided in a more accessible location and coupled to the logic circuit 18. After testing, the original contact pad 16 is once again used to access the logic circuit 18. The redundant contact pad 20, however, also remains coupled to the logic circuit 18 and, as described above, may adversely affect the performance of the logic circuit in particular and the entire die in general.

Figure 3:
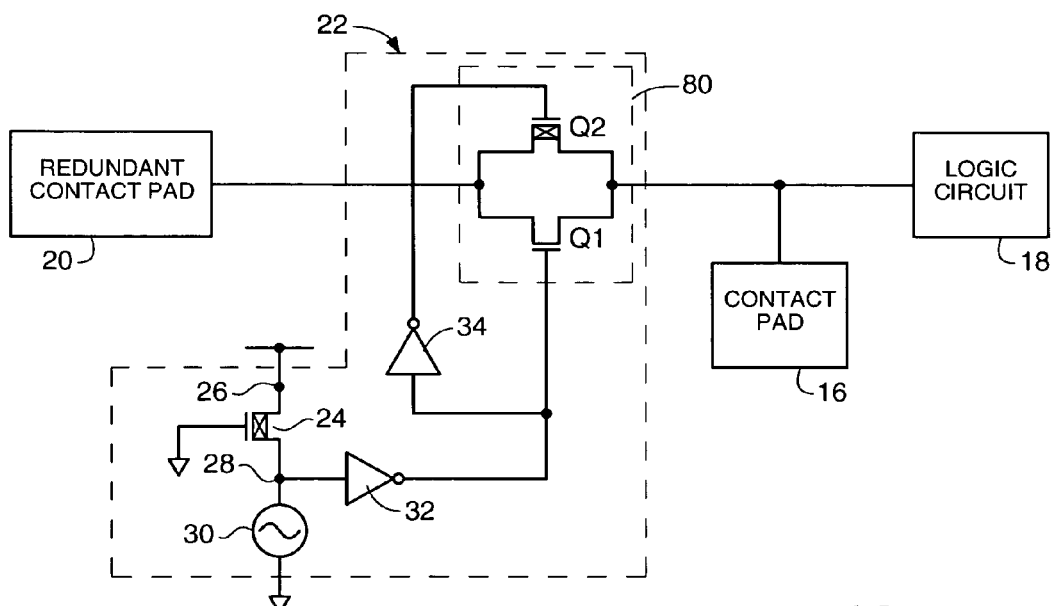
FIG. 3 illustrates a first exemplary embodiment of the present invention.

FIG. 3 illustrates one embodiment of the current invention that solves the problem remaining in the prior art solution. An isolation circuit 22 is electrically interposed between the redundant contact pad 20 and the logic circuit 18 in order to regulate electrical communication therebetween. The isolation circuit 22 in this embodiment comprises a p-channel long L device 24 having a source coupled to a potential node 26. The potential node 26 is configured to accept a voltage source. The p-channel long L device 24 also has a drain coupled to a signal node 28. The gate of the long L device 24 is bled to ground, thereby allowing signal node 28 to constantly receive a voltage signal from the potential node 26.

The signal node 28 carries the voltage signal through a pathway leading to ground, but that pathway is interrupted by a fuse 30. Moreover, the signal node 28 is coupled to a first inverter 32. The output of the first inverter 32 connects to the gate of an n-channel transistor Q1, which is a component of a multiplexer 80 electrically interposed between the redundant contact pad 20 and the logic circuit 18. In addition, the output of the first inverter 32 serves as the input for a second inverter 34. This second inverter 34 connects to the gate of a p-channel transistor Q2, which is another component of the multiplexer 80.

In operation, the potential node 26, the p-channel long L device 24, the signal node 28, and the fuse 30 cooperate to determine the drive state of the multiplexer 80. The fuse 30 is initially intact and provides grounding communication for the signal node 28. Because the signal node 28 is grounded, a low voltage signal, or "logic 0," is generated and carried to the first inverter 32. Accordingly, the first inverter outputs a high voltage signal, or "logic 1." The high signal drives the n-channel transistor Q1. The high signal also serves as input to the second inverter 34, and the resulting low signal drives the p-channel transistor Q2. With transistors Q1 and Q2 on, a range of signals may be transmitted between the redundant contact pad 20 and the logic circuit 18.

The redundant contact pad 20 can then be isolated by programming or "blowing" the fuse 30. With fuse 30 blown, the signal node 28 no longer has a direct path to ground. As a result, a high signal is sent in a new direction—to the first inverter 32. The resulting low signal turns off the n-channel transistor Q1. Further, the low signal is changed by the second inverter 34 to a high signal that turns off the p-channel transistor Q2. With both transistors Q1 and Q2 off, electrical communication between the redundant contact pad 20 and the logic circuit 18 is prevented.

Figure 4:
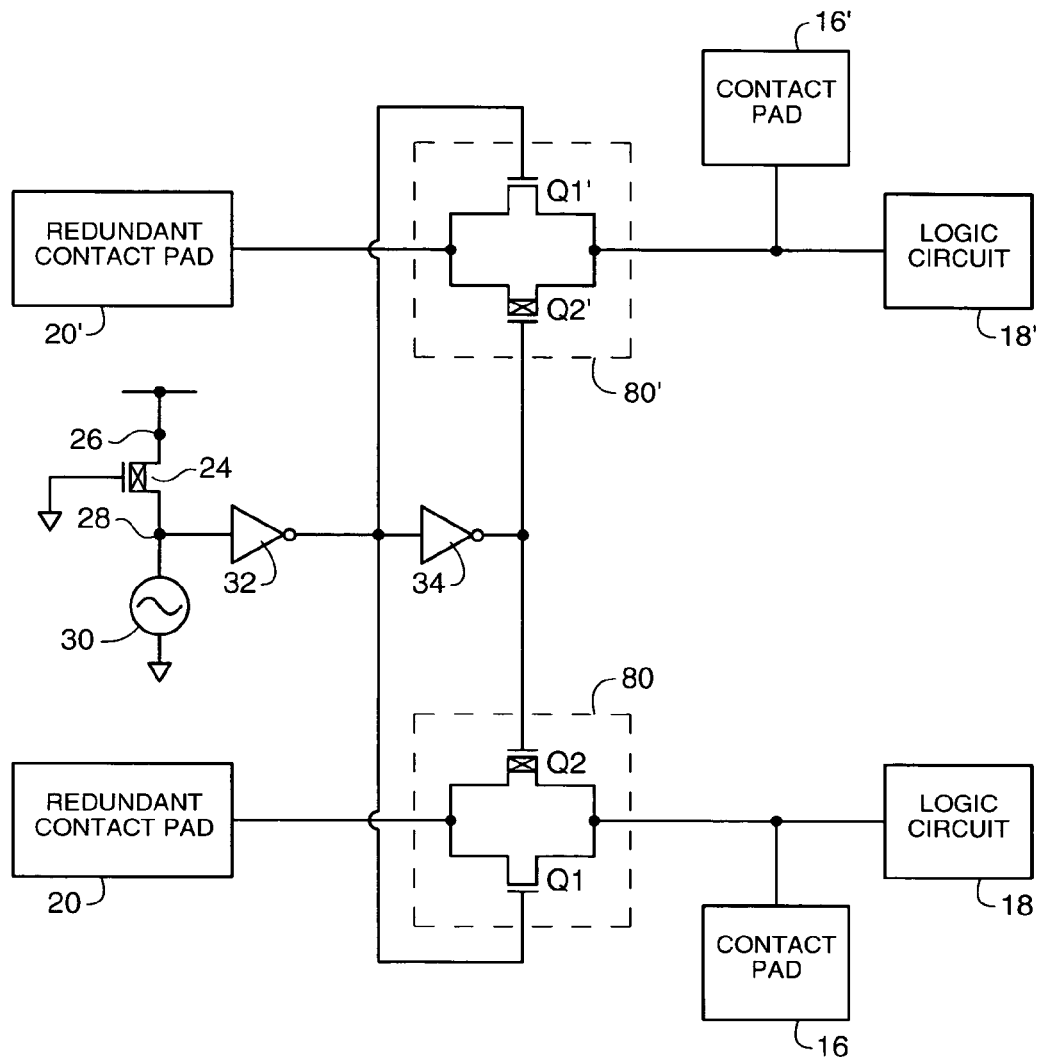
FIG. 4 illustrates a second exemplary embodiment of the present invention.

Moreover, the potential node 26/signal node 28/fuse 30 configuration, hereinafter referred to as a "program circuit," is not limited to driving only one multiplexer. As seen in FIG. 4, first inverter 32 and second inverter 34 can also be coupled to transistors Q1' and Q2' of a second multiplexer 80', wherein the second multiplexer 80' is electrically interposed between another logic circuit 18' and another redundant contact pad 20'. As a result, this embodiment provides for the electrical isolation of two redundant contact pads by blowing only one fuse. Contact pads 16 and 16' maintain electrical communication with their respective logic circuits 18 and 18'. It follows that additional logic circuits could be similarly accommodated.

Figure 5:
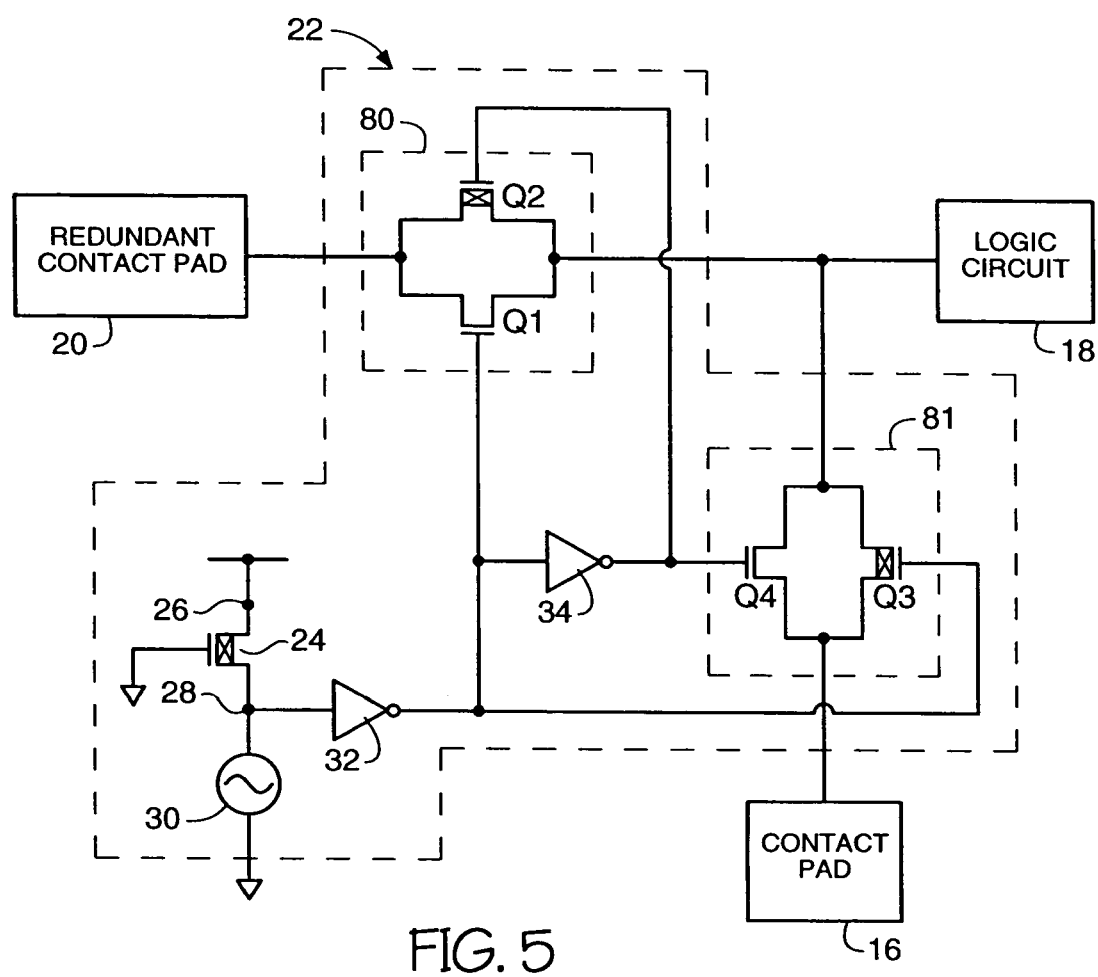
FIG. 5 illustrates a third exemplary embodiment of the present invention.

In yet another embodiment illustrated in FIG. 5, a multiplexer 81 is electrically interposed between contact pad 16 and the logic circuit 18. As with multiplexer 80, multiplexer 81 is comprises a p-channel transistor Q3 and an n-channel transistor Q4. However, whereas the first inverter 32 is coupled to the n-channel transistor Q1 of multiplexer 80, the first inverter 32 is instead coupled to the p-channel transistor Q3 of multiplexer 81. Similarly, the second inverter 34 connects to the p-channel transistor Q2 in multiplexer 80 but drives the n-channel transistor Q4 in multiplexer 81. By switching the driving signals in this fashion, the initial signals that serve to turn on multiplexer 80 also turn off multiplexer 81. Conversely, blowing the fuse, which turns off multiplexer 80, serves to turn on multiplexer 81.

Figure 6:
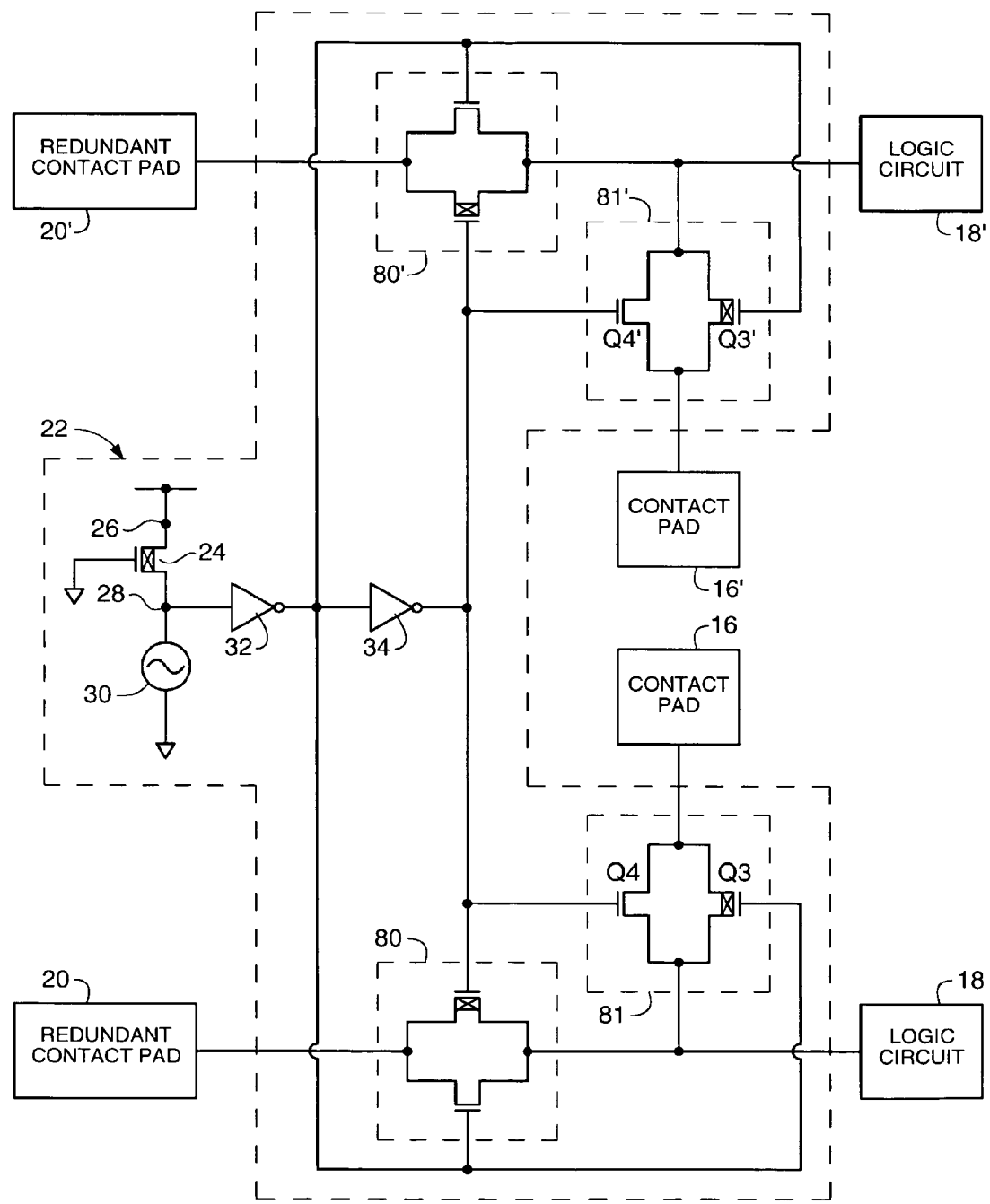
FIG. 6 illustrates a fourth exemplary embodiment of the present invention.

Further, the embodiments depicted in FIGS. 4 and 5 could be combined so that blowing one fuse 30 switches the communication arrangement for two or more logic circuits. Thus, as demonstrated in FIG. 6, multiplexers 80' and 81' are driven by the program circuit to allow electrical communication between logic circuit 18' and redundant contact pad 20', while at the same time electrically isolating contact pad 16'. Meanwhile, the same program circuit allows for electrical communication between logic circuit 18 and redundant contact pad 20 and electrically isolates contact pad 16. Blowing fuse 30 switches the electrical communication pathways for both logic circuits 18 and 18'.

Figure 7:
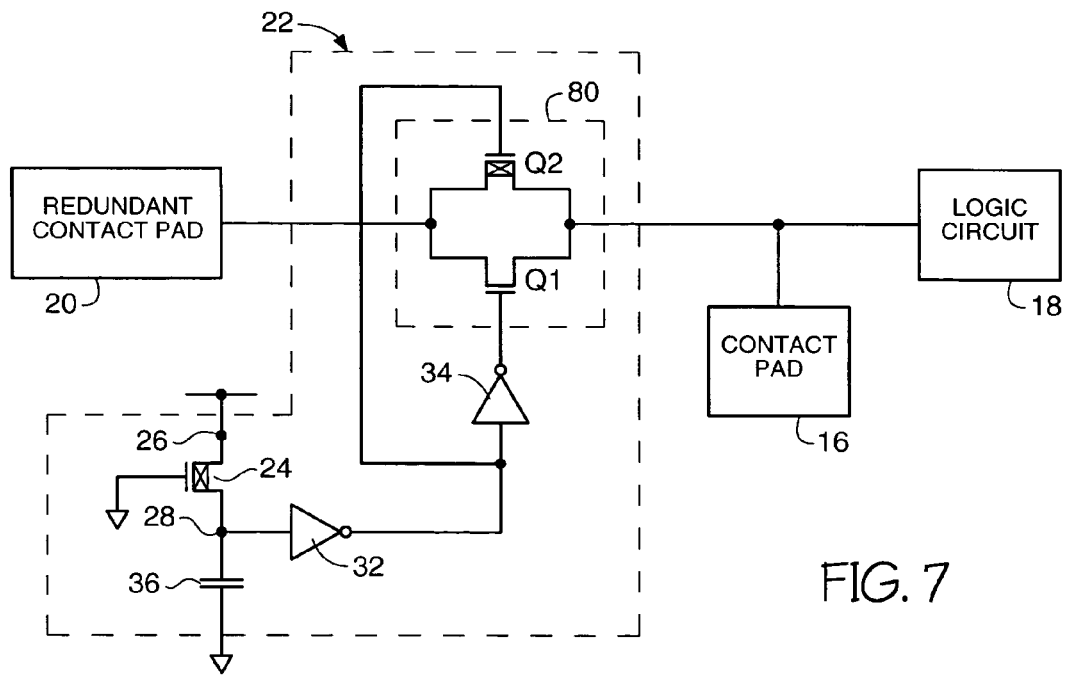
FIG. 7 portrays a fifth exemplary embodiment of the present invention.

FIG. 7 demonstrates another embodiment of the current invention. The isolation circuit 22 has a similar configuration to the one in FIG. 3 except that (1) the fuse 30 has been replaced with an anti-fuse 36; (2) the second inverter 34 now drives the n-channel transistor Q1; and (3) the first inverter 32 directly drives the p-channel transistor Q2. Given this configuration, the direct path from the signal node 28 to ground is initially barred by the anti-fuse 36. Consequently, a high signal is transmitted to the first inverter 32. The low signal output drives the p-channel transistor Q2. The second inverter 34 turns this low signal into a high signal in order to drive the n-channel transistor Q1. With both transistors Q1 and Q2 on, the redundant contact pad is fully coupled to the logic circuit. Once the anti-fuse is programmed, however, the signal node 28 becomes grounded and a low signal is transmitted to the first inverter 32, which sends a high turn-off signal to the p-channel transistor Q2. Moreover, this high signal is altered by the second inverter 34 so that a low signal turns off the n-channel transistor Q1. With both transistors Q1 and Q2 off, the redundant contact pad 20 is no longer in electrical communication with logic circuit 18.

It can be appreciated that an anti-fuse 36 could replace the fuse many of the embodiments of this invention. Accordingly the "program circuit" could include an anti-fuse.

Figure 8:
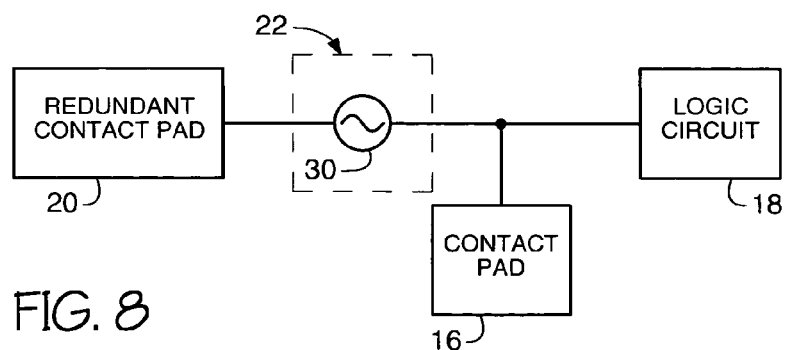
FIG. 8 depicts a sixth exemplary embodiment of the present invention.

An embodiment illustrated in FIG. 8 demonstrates that the isolation circuit 22 can comprise the fuse 30 directly interposed between the redundant contact pad 20 and the logic circuit 18, wherein programming the fuse isolates the redundant contact pad 20. Programming can occur at the completion of testing or at a stage in any other application where isolation of a contact pad is beneficial. It should be noted that, while this embodiment conserves die space, embodiments such as those in FIGS. 3 through 7 are better at preventing accidental programming due to an ESD event.

Figure 9:
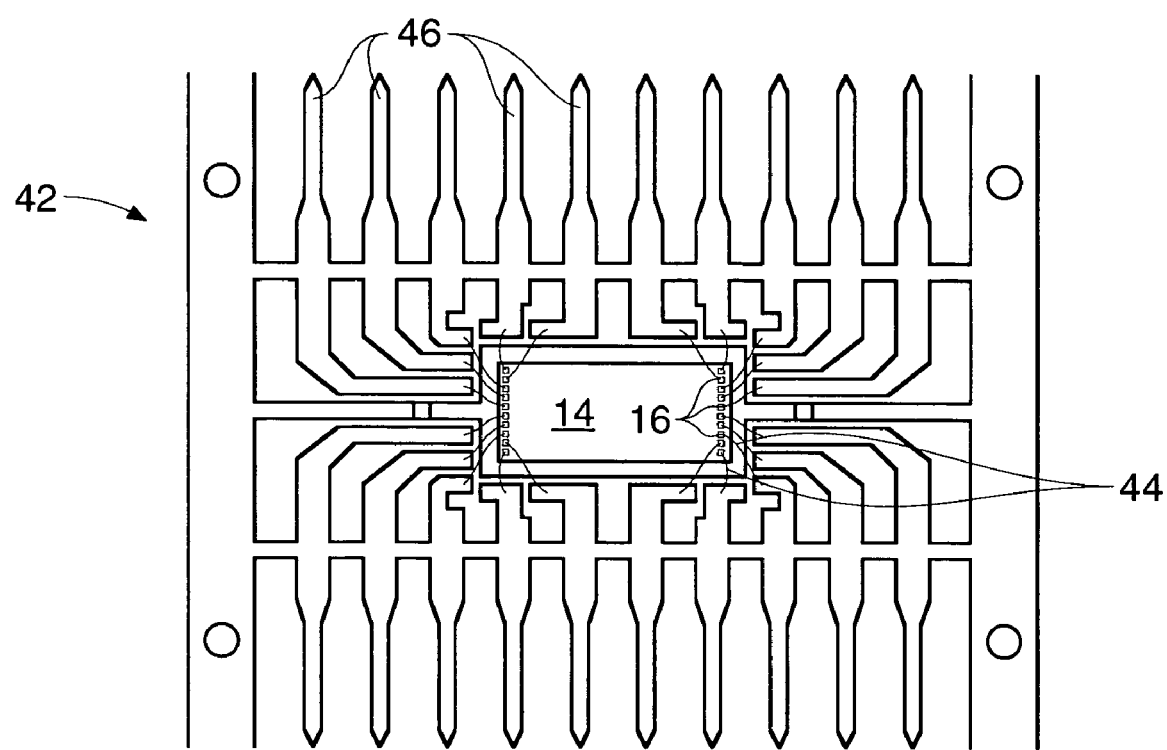
FIG. 9 depicts a lead frame having a conductive lead configuration and accommodating a plurality of dies.
Figure 10A:
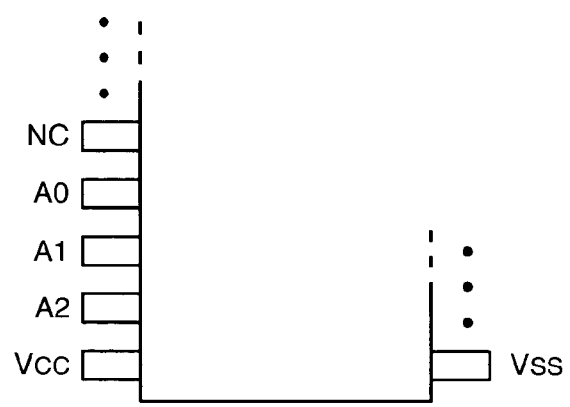
FIG. 10a is a partial pin-out diagram of a typical integrated device that exists in the prior art.

If wafer testing indicates a likelihood that the wafer has a yield of good quality dies, the dies are separated from the wafer and undergo a packaging process. Many such processes involve attaching a die 14 to a lead frame 42, such as one shown in FIG. 9, and using bond wires 44 to connect the contact pads 16 to the conductive leads 46 of the lead frame 42. The die/lead frame assembly may then be encased, with the outer ends of the conductive leads 46 remaining exposed to allow communication with external devices. However, some conductive leads may not be connected to the contact pads of a die. Such a conductive lead is designated as a "no-connect" or "NC" pin, as demonstrated in the pin-out diagram of FIG. 10*a*.

Figure 10B:
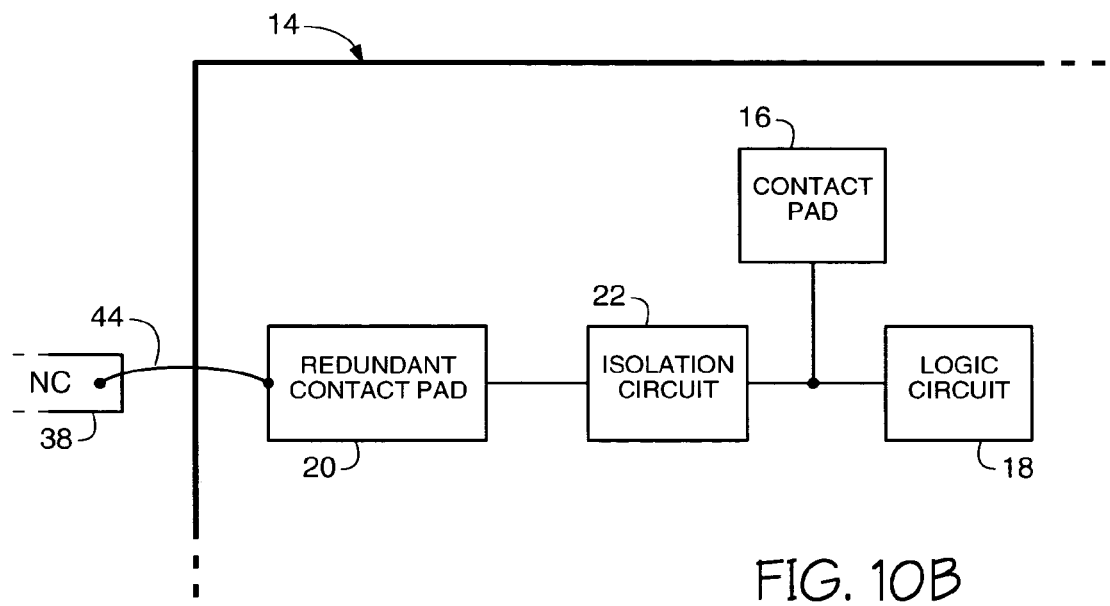
FIG. 10b demonstrates a seventh exemplary embodiment of the present invention.

After assembly, a packaged device may then be subjected to further testing. FIG. 10*b* depicts an embodiment of the current invention that makes use of the no-connect pin 38 of the packaged die 14 for such testing. Prior to assembly, the die 14 is configured to include a redundant contact pad 20 coupled to a logic circuit 18 through an isolation circuit 22. Further, the no-connect pin 38 is connected to the redundant contact pad 20 by a bond wire 44. As a result, communication with the logic circuit 18 may be accomplished during testing of the device through the no-connect pin 38. Once testing is complete, the isolation circuit 22, which may comprise one of the configurations described above, is programmed, thereby halting communication between the no-connect pin and the logic circuit.

Figure 11:
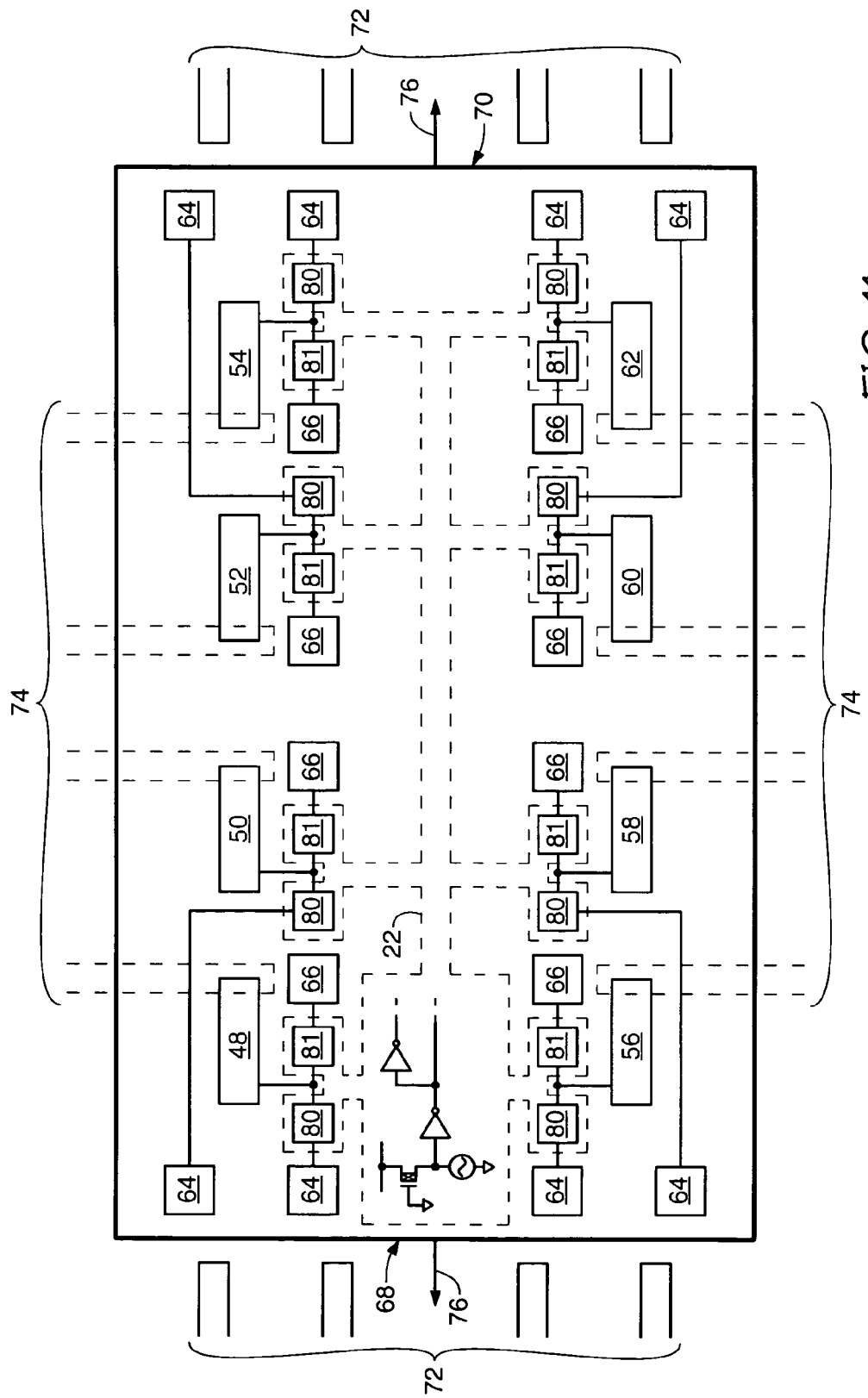
FIG. 11 displays an eighth exemplary embodiment of the present invention.

Moreover, other embodiments of the current invention allow for isolating an additional contact pad that is not necessarily a test-mode pad. As shown in FIG. 11, isolation circuits can be used to allow a die to adapt to more than one lead frame configuration. FIG. 11 shows eight logic circuits 48, 50, 52, 54, 56, 58, 60, and 62 coupled to a first group of contact pads 64 located on opposing sides 68, 70 of a die 14. These eight logic circuits are also coupled to a second group of contact pads 66 extending along a center axis 76 of the die 14 between the between the opposing sides 68, 70. An isolation circuit 22 is also provided. In this embodiment, the isolation circuit 22 resembles the one depicted in FIG. 6, where the isolation circuit 22 not only services more than one logic circuit but also enables exclusive electrical communication within a logic circuit to be switched between two contact pads.

FIG. 11 further demonstrates that the first group of contact pads 64 is configured to accommodate a lead frame having conductive leads 72 that address the opposing sides 68 and 70 of the die 14. The second group of contact pads 66 will favorably receive a lead frame having conductive leads 74 addressing internal portions of the die, such as those near the center axis 76. Thus, depending on the lead frame ultimately chosen, the current invention allows for particular contact pads to be isolated accordingly. As in FIG. 6, the isolation circuit in FIG. 11 is assumed to be configured to turn on the transistors in multiplexers 80 when the fuse is intact. It should also be noted that multiplexers 80 are interposed between the first group of contact pads 64 and their respective logic circuit. Further, multiplexers 81 are interposed between the second group of contact pads 66 and their respective logic circuit. Thus, if the fuse 30 is not blown, then electrical communication with the logic circuits 48, 50, 52, 54, 56, 58, 60, and 62 is achieved solely through the first group of contact pads 64. Should it be determined to package the die 14 with a lead frame having conductive leads 72, the fuse remains unprogrammed, the conductive leads 72 are wire bonded to that group, and the second group of contact pads 66 remain isolated. If, however, a lead frame including conductive leads 74 is to be packaged with the die 14, then by programming a single fuse 30, the second group of contact pads will be in electrical communication with the logic circuits 48, 50, 52, 54, 56, 58, 60, and 62. Moreover, the first group of contact pads 64, having been isolated due to blowing the fuse, will not contribute additional capacitance to the circuit operations.

Figure 12:
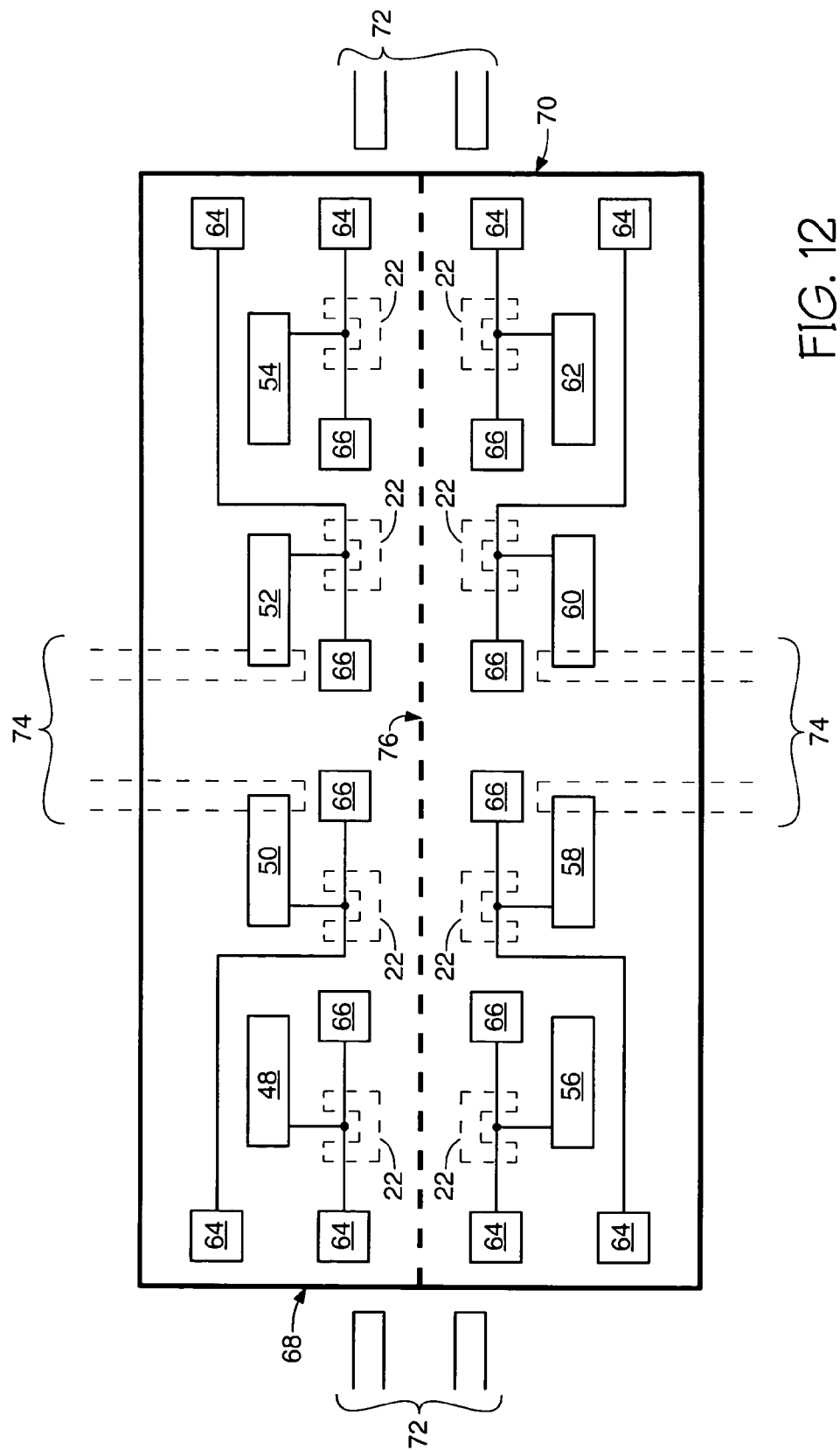
FIG. 12 displays a ninth exemplary embodiment of the present invention.

The embodiment illustrated in FIG. 12 can accommodate still other lead frames, wherein only some of the contact pads of a group need to be isolated. While the logic circuit/contact pad layout in FIG. 12 is similar to the configuration in FIG. 11, the isolation circuitry is preferably more like the arrangement in FIG. 5. Furthermore, It would be beneficial in this embodiment to use a plurality of isolation circuits 22 in order to provide one fuse 30 for every contact pad pair associated with a logic circuit. Given this configuration, each fuse 30 can be programmed as needed to accommodate the lead frame. For example, the lead frame in FIG. 12 has some conductive leads 74 addressing internal portions of the die near the center axis 76, and the lead frame has other conductive leads 72 that address opposing sides 68 and 70 of the die 14. Therefore, only some of the contact pads in the first group 64 should be isolated, as should some of the contact pads in the second group 66. The embodiment in FIG. 12 allows this selectivity.

It would be a further benefit to associate a particular group of contact pads with multiplexers having the same initial state. For example, assuming that each contact pad in the first group 64 is respectively coupled to the multiplexer 80 of each isolation circuit 22, it follows that the entire first group 64 is initially in electrical communication with the logic circuits 48, 50, 52, 54, 56, 58, 60, and 62. It also follows that the entire second group 66 is associated with the multiplexers 81 of the isolation circuits 22 and are therefore isolated. In order to accommodate the conductive leads 72, 74 illustrated in FIG. 12, it is relatively easy, given contact pad/isolation circuit association, to determine that only the fuses 30 corresponding to logic circuits 50, 52, 58, and 60 need to be blown.

In addition, one can appreciate that other lead frame adapter embodiments could use isolation circuits similar to those depicted in FIGS. 3, 7, and 8.

Finally, one of ordinary skill can appreciate that, although specific embodiments of this invention has been described for purposes of illustration, various modifications can be made without departing from the spirit and scope of the invention. For example, concerning the embodiments discussed above that use a fuse, such a fuse could comprise one of various types of fuses, including a link fuse or a laser fuse. Alternatively, the fuse could be replaced by an anti-fuse with minor configuration changes. Moreover, embodiments such as those in FIGS. 3 through 7 using both a p-channel and an n-channel transistor as a link could be modified to use only one of the transistors. Accordingly, the invention is not limited except as stated in the claims.

The invention claimed is:

1. A communication regulator circuit for a plurality of logic circuits, comprising:
 a first group of multiplexers respectively coupled to said plurality of logic circuits and further configured to allow electrical communication to and from said plurality of logic circuits in response to a reception of a driving signal;
 a second group of multiplexers respectively coupled to said plurality of logic circuits and further configured to allow electrical communication to and from said plurality of logic circuits in response to a reception of said driving signal; and
 at least one driving circuit coupled to said first group and said second group of multiplexers and configured to initially transmit said driving signal exclusively to said first group of multiplexers and further configured to optionally permanently transmit said driving signal exclusively to said second group of multiplexers, wherein said at least one driving circuit comprises a plurality of driving circuits, wherein each driving circuit of said plurality of driving circuits is respectively coupled to a multiplexer in said first group and to a multiplexer in said second group.

* * * * *